(12) United States Patent  
Okada et al.

(10) Patent No.: US 7,989,938 B2
(45) Date of Patent: Aug. 2, 2011

(54) SEMICONDUCTOR DEVICE FOR FINGERPRINT RECOGNITION

(75) Inventors: Akira Okada, Kawasaki (JP); Mitsuru Sato, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/382,532

(22) Filed: Mar. 18, 2009

(65) Prior Publication Data

US 2009/0184408 A1    Jul. 23, 2009

Related U.S. Application Data

(62) Division of application No. 11/330,293, filed on Jan. 12, 2006, now abandoned, which is a division of application No. 10/765,999, filed on Jan. 29, 2004, now Pat. No. 7,015,579.

(30) Foreign Application Priority Data

Mar. 31, 2003 (JP) ................................. 2003-097095

(51) Int. Cl.
*H01L 238/48* (2006.01)

(52) U.S. Cl. ........ 257/680; 257/433; 257/434; 257/704; 257/774; 257/E23.002

(58) Field of Classification Search .................. 257/680, 257/774, E23.002, E23.011, 433, 434, 681, 257/704
See application file for complete search history.

(56) References Cited

U.S. PATENT DOCUMENTS

| | | | |
|---|---|---|---|
| 5,867,368 A | 2/1999 | Glenn | |
| 5,949,655 A | 9/1999 | Glen | |
| 6,445,077 B1* | 9/2002 | Choi et al. | 257/786 |
| 6,483,324 B1* | 11/2002 | Mitter et al. | 324/689 |
| 6,528,723 B2 | 3/2003 | Fries et al. | |
| 6,765,236 B2* | 7/2004 | Sakurai | 257/98 |
| 6,836,953 B2 | 1/2005 | Fries et al. | |
| 2004/0061222 A1* | 4/2004 | Bai | 257/734 |
| 2004/0183179 A1* | 9/2004 | Shieh et al. | 257/686 |

FOREIGN PATENT DOCUMENTS

| | | |
|---|---|---|
| JP | 9-289268 | 11/1997 |
| JP | 2001-516957 A | 10/2001 |
| JP | 2002-516439 | 6/2002 |
| JP | 2002-520627 A | 7/2002 |
| JP | 2003-083708 A | 3/2003 |
| JP | 2004-172467 | 6/2004 |
| WO | WO 02/095801 A2 | 11/2002 |

OTHER PUBLICATIONS

Chinese Office Action dated Aug. 26, 2005.
Japanese Office Action, Japanese Patent Application No. 2003-097095 mailed Jul. 4, 2006.
Office Action Issued in JP 2003-097095 mailed Apr. 22, 2008.

* cited by examiner

*Primary Examiner* — Cuong Q Nguyen
*Assistant Examiner* — Trang Q Tran
(74) *Attorney, Agent, or Firm* — Westerman, Hattori, Daniels & Adrian, LLP

(57) ABSTRACT

A semiconductor device is disclosed that performs fingerprint recognition on the electrostatic-capacity principle. A finger sweeping across a fingerprint recognition area of a semiconductor chip provides positive fingerprint recognition operations with improved reliability.
The semiconductor device includes the semiconductor chip having a sensor unit that performs fingerprint recognition, and a substrate having an opening formed in the position corresponding to the sensor unit. The semiconductor chip is flip chip bonded to the substrate such that the sensor unit corresponds to the opening, and except for the formed position of the opening, an under-fill material is provided between the semiconductor chip and the substrate.

1 Claim, 16 Drawing Sheets

1 FINGERPRINT SENSOR

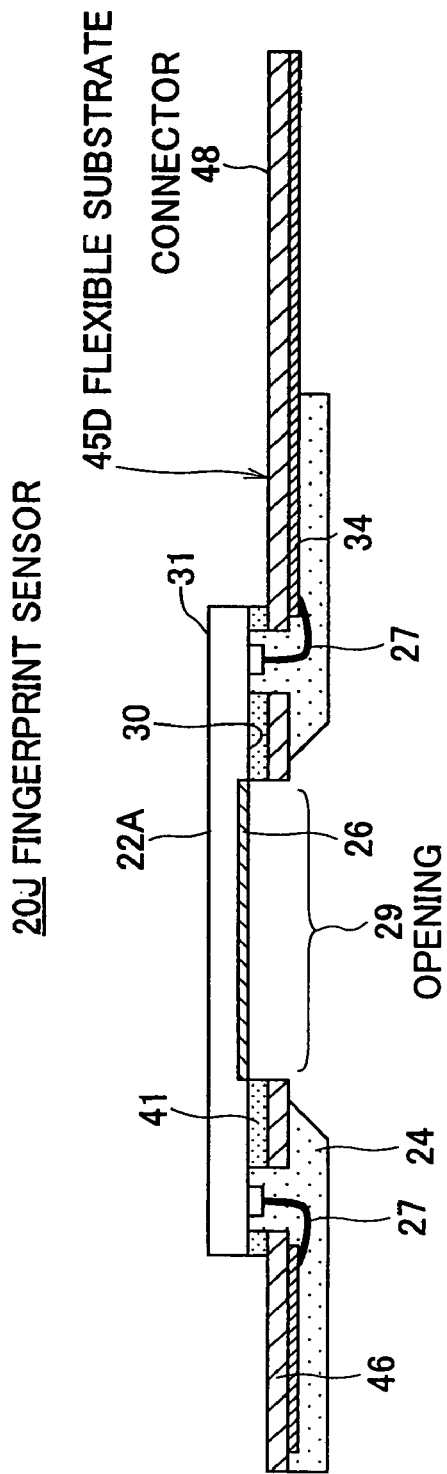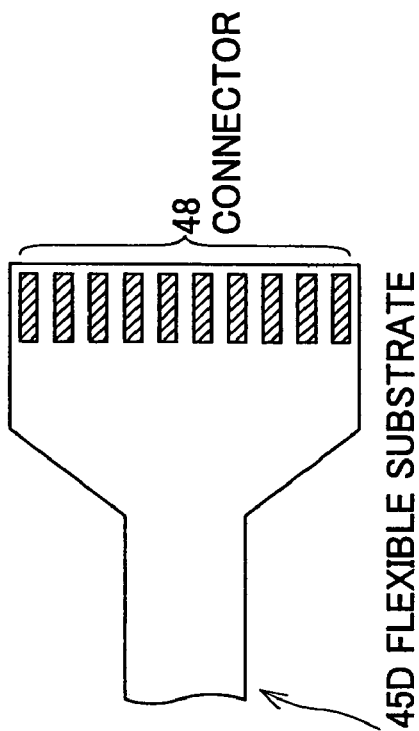

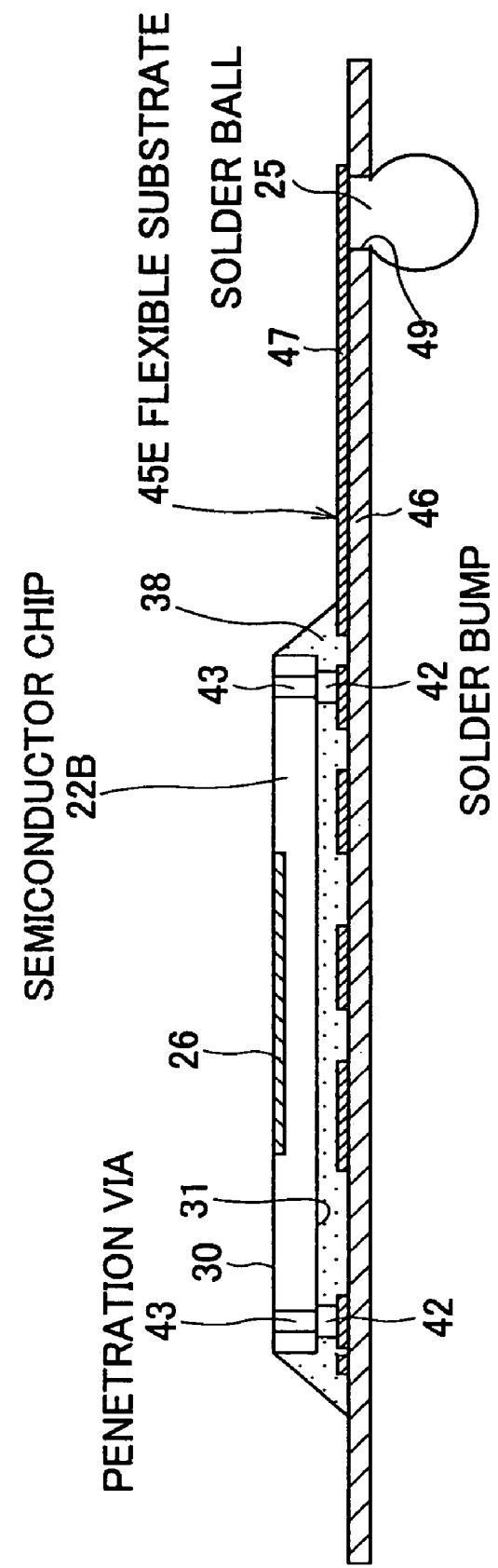

SEMICONDUCTOR DEVICE FOR FINGERPRINT RECOGNITION

CROSS REFERENCE TO RELATED APPLICATION

The present application is a divisional of application Ser. No. 11/330,293 filed on Jan. 12, 2006, which is a divisional of application Ser. No. 10/765,999 filed on Jan. 29, 2004, now U.S. Pat. No. 7,015,579 issued on Mar. 21, 2006.

BACKGROUND OF THE PRESENT INVENTION

1. Field of the Present Invention

The present invention generally relates to a semiconductor device for performing fingerprint recognition, and particularly relates to a semiconductor device for performing fingerprint recognition by tracing a fingerprint provided by a finger to a recognition area of the semiconductor device for fingerprint recognition.

In recent years, portable apparatuses have become capable of providing high performances. Especially, portable telephones are capable of storing a large volume of personal information with increases in storage capacity, and it is universally required that the personal information not be perused by persons other than owners.

Also, systems that perform electronic banking by using a portable telephone as a terminal are available. With these developments, a fingerprint sensor that is an authentication device using the fingerprint attracts attention.

In these applications, the semiconductor device for fingerprint recognition is required to perform fingerprint recognition with high reliability.

2. Description of the Related Art

Conventionally, there are an optical detecting method and an electrostatic-capacity detecting method for fingerprint detection using a fingerprint collating system. Of these, the electrostatic-capacity detecting method is the method of detecting an electrostatic-capacity value between a finger and an electrode formed in a fingerprint detection area of a semiconductor device for fingerprint recognition. Since a semiconductor device for fingerprint recognition using the electrostatic-capacity detecting method can be easily miniaturized, such applications in small electronic apparatuses and the like are advancing.

Since the semiconductor device for fingerprint recognition of the electrostatic-capacity detecting method requires a finger to contact the electrode and to sweep in a direction, the fingerprint detection area of the semiconductor device is exposed. For this reason, the structure is such that an opening is formed in a sealing resin that encloses the semiconductor device, and the fingerprint detection area is exposed to the outside through the opening.

Further, as a packaging structure of the semiconductor device for fingerprint recognition, packaging structures used by common semiconductor devices are used, for example, a BGA (Ball Grid Array) type packaging structure is often used.

FIG. 1 shows an example of this kind of semiconductor device for fingerprint recognition (henceforth a fingerprint sensor). In essence, a fingerprint sensor 1 includes a semiconductor chip 2, a substrate 3, and a sealing resin 4.

A fingerprint recognition area (henceforth a sensor unit 6) for fingerprint recognition is formed on a circuit formation side (upper surface according to FIG. 1) of the semiconductor chip 2. As a finger sweeps across the upper part of the sensor unit 6, the semiconductor chip 2 detects the electrostatic-capacity value between the finger and the sensor unit 6, and detects the fingerprint.

The substrate 3 is a glass epoxy substrate, and is structured such that a wiring layer is formed on both upper and lower sides of a glass epoxy insulation material. The semiconductor chip 2 is fixed to the substrate 3 by a die bonding material 8.

At this instance, the rear side (i.e., the side opposite to the side on which the sensor unit 6 is formed, namely, the bottom surface) of the semiconductor chip 2 is fixed to the substrate 3 so that the sensor unit 6 is exposed to the outside for a finger to sweep across. Further, a golden wire 7 electrically connects the semiconductor chip 2 to the substrate 3.

The sealing resin 4 is formed such that the semiconductor chip 2 and the golden wire 7 are covered, and thus protected. In order for the sensor unit 6 to be exposed for being swept by the finger, an opening 9 is formed in the sealing resin 4 at the position that corresponds to the sensor unit 6. In this manner, even if the sealing resin 4 is formed, the finger can touch the sensor unit 6 (refer to, for example, JP, 9-289268, A (page 6, FIG. 11)).

FIG. 2 shows how the sealing resin 4 is formed. As mentioned above, it is necessary to form the opening 9 in the sealing resin 4 at the position that corresponds to the sensor unit 6. For this reason, in a conventional practice, a molding metal 10 is prepared with a spacer 11 so that the sensor unit 6 is covered as illustrated.

The spacer 11 is formed of a flexible material, such as plastic, and when clamping the molding metal 10 for forming the sealing resin 4, the spacer 11 closely adheres to the sensor unit 6 such that that the sealing resin 4 is prevented from flowing into the sensor unit 6.

According to the conventional fingerprint sensor 1, there is a possibility that the resin can leak from a minute crevice between the semiconductor chip 2 and the spacer 11 when forming the sealing resin 4. If the resin leaks, the resin starts covering the sensor unit 6 as shown in FIG. 3 (such leaking resin is called resin flash 12). When the resin flash 12 is generated on the surface of the sensor unit 6, there is a problem in that the semiconductor chip 2 cannot properly operate, and accurate fingerprint recognition becomes impossible.

Further, when forming the sealing resin 4, the spacer 11 directly contacts the sensor unit 6, and the spacer 11 is pressed by the molding metal 10 to the semiconductor chip 2. Although the spacer 11 is made of a flexible material, such as plastic, it is well known that great clamping force is applied when clamping the molding metal 10. For this reason, according to the conventional practice, wherein the spacer 11 directly contacts the sensor unit 6, there is an additional problem in that the sensor unit 6 and the semiconductor chip 2 may receive damage such as a crack and the like, causing the reliability to be degraded.

SUMMARY OF THE PRESENT INVENTION

An aspect of the present invention is to provide a semiconductor device for fingerprint recognition including a semiconductor chip that contains a fingerprint recognition area for performing fingerprint recognition, a substrate that has an opening in the position corresponding to the fingerprint recognition area, wherein the semiconductor chip is installed on the substrate by flip chip bonding, the fingerprint recognition area corresponding to the opening, and an under-fill material is provided between the semiconductor chip and the substrate except for the formation position of the opening.

Another aspect of the present invention is to provide a semiconductor device for fingerprint recognition according to the second mode of the present invention including the semiconductor chip with the fingerprint recognition area for performing fingerprint recognition, the substrate that has the opening in the position corresponding to the fingerprint recognition area, and a sealing resin for protecting the semiconductor chip and the substrate, wherein the semiconductor chip is arranged on the substrate so that the fingerprint recognition area corresponds to the opening, a wire connection is made between the semiconductor chip and the substrate through an opening for wire, the opening for wire being formed in the substrate, and the sealing resin is provided on a first side of the substrate, the first side being opposite to a second side on which the semiconductor chip is arranged.

Further, another aspect of the present invention is to provide a semiconductor device for fingerprint recognition according to the third mode of the present invention including the semiconductor chip with the fingerprint recognition area for performing fingerprint recognition, and the substrate that mounts the semiconductor chip, wherein the semiconductor chip is mounted on the substrate by flip chip bonding so that the side that is opposite to the fingerprint recognition area formation side of the semiconductor chip faces the substrate with a penetration via being provided in the semiconductor chip.

Further still, another aspect of the present invention is to provide a semiconductor device for fingerprint recognition according to the fourth mode of the present invention including the semiconductor chip having a penetration via, and the fingerprint recognition area for performing fingerprint recognition, a re-wiring that is formed on the opposite side of the fingerprint recognition area formation side of the semiconductor chip, the re-wiring being electrically connected to the fingerprint recognition area by the penetration via, and an insulated layer formed so that the opposite side is covered except for the external connection terminal formation part of the re-wiring.

Accordingly, the present invention provides a semiconductor device for fingerprint recognition with high reliability that substantially obviates one or more of the problems caused by the limitations and disadvantages of the related art.

BRIEF DESCRIPTION OF THE DRAWINGS

FIG. 15 is a cross-sectional view of the semiconductor device for fingerprint recognition according to the tenth embodiment of the present invention;

FIG. 16 is a cross-sectional view of the semiconductor device for fingerprint recognition according to the eleventh embodiment of the present invention;

DESCRIPTION OF THE PREFERRED EMBODIMENTS

In the following, embodiments of the present invention are described with reference to the accompanying drawings.

Figure 4:
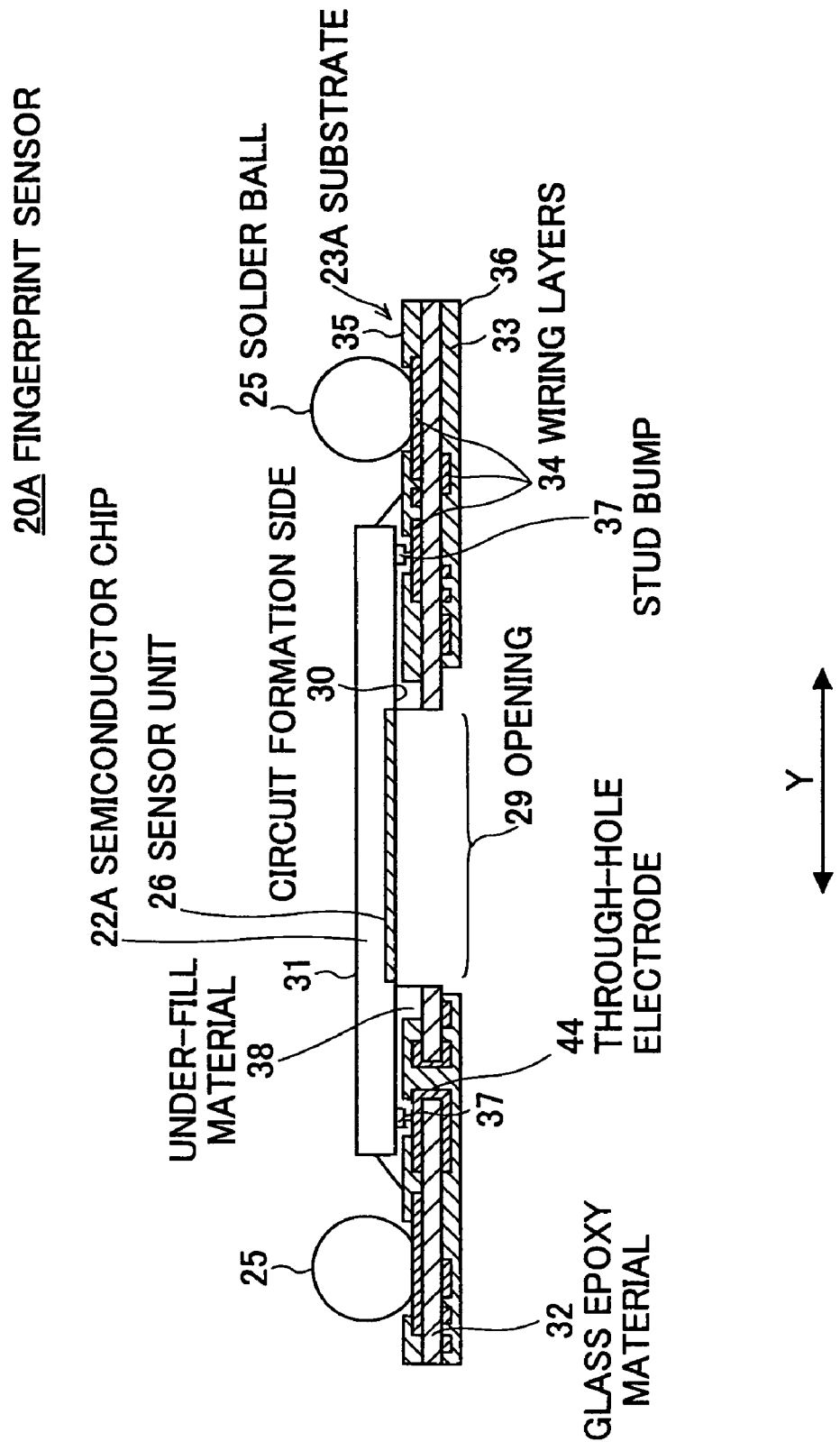
FIG. 4 is a cross-sectional view of a semiconductor device for fingerprint recognition according to the first embodiment of the present invention.
Figure 5:
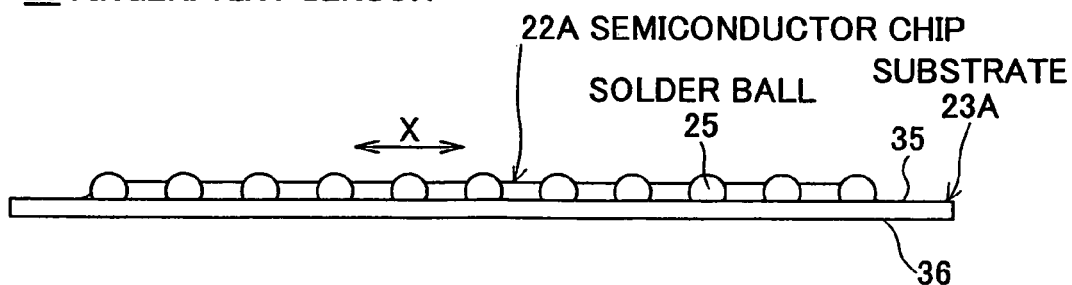
FIG. 5 is a front view of the semiconductor device for fingerprint recognition according to the first embodiment of the present invention.
Figure 6:
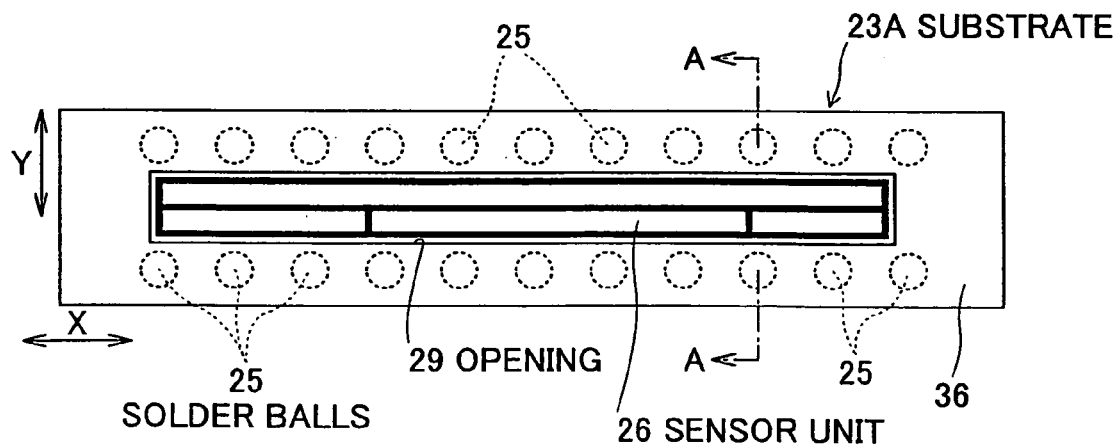
FIG. 6 is a bottom plan view of the semiconductor device for fingerprint recognition according to the first embodiment of the present invention.

FIG. 4, FIG. 5, and FIG. 6 show a semiconductor device 20A for fingerprint recognition (the semiconductor device for fingerprint recognition shall be hereafter called a fingerprint sensor for short) that is the first embodiment of the present invention. FIG. 4 is a cross-sectional view (taken along the A-A line in FIG. 6) of the fingerprint sensor 20A, FIG. 5 is a front view of the fingerprint sensor 20A, and FIG. 6 is a bottom plan view of the fingerprint sensor 20A.

The fingerprint sensor 20A includes a semiconductor chip 22A and a substrate 23A. The semiconductor chip 22A includes a sensor unit 26 serving as a fingerprint recognition area that carries out fingerprint recognition, the sensor unit 26 being arranged on a circuit formation side 30 of the semiconductor chip 22A.

The semiconductor chip 22A performs fingerprint recognition on the electrostatic-capacity principle as a finger sweeps across the sensor unit 26 in the directions indicated by arrows X in FIG. 6. The semiconductor chip 22A operating on the electrostatic-capacity principle is shorter in the directions indicated by arrows Y, and is longer in the directions of the arrows X, where the directions X and the directions Y are arranged to be orthogonal to each other. Accordingly, the fingerprint sensor 20A of the present invention can be made smaller than other fingerprint recognition devices that are based on optical means.

The substrate 23A is a so-called glass epoxy substrate. As shown in FIG. 4, the fingerprint sensor 20A includes a glass epoxy material 32 serving as a core material, wiring layers 34 prepared on both sides of the glass epoxy material 32, and an insulated layer 33 for protecting the wiring layers 34, which are prepared as the substrate 23A. The wiring layer 34 formed on the upper surface and the wiring layer 34 formed on the undersurface of the glass epoxy material 32 are electrically connected by a through hole electrode 44.

The fingerprint sensor 20A further includes solder balls 25 prepared on the substrate 23A, which solder balls serve as external connection terminals. According to the present embodiment, the solder balls 25 are arranged on a chip mounting side 35 of the substrate 23A. Accordingly, the insulated layer 33 is removed from positions on the chip mounting side 35 of the substrate 23A where the solder balls 25 are arranged.

Further, the height of the solder balls 25 measured from the surface of the chip mounting side 35 is set up higher than the height of the semiconductor chip 22A measured from the surface of the chip mounting side 35. In addition, in another fingerprint sensor specified below wherein the semiconductor chip 22A is wire-bonded, the height of the solder balls 25 from the chip mounting side 35 is also set up higher than the height of the semiconductor chip 22A from the chip mounting side 35.

Furthermore, an opening 29 is beforehand formed in the substrate 23A. The opening 29 is formed such that the opening 29 penetrates the substrate 23A, and the form and size (area) are made to correspond to the sensor unit 26 formed in the semiconductor chip 22A.

The semiconductor chip 22A is arranged on the substrate 23A by flip chip bonding. A specific process for carrying out the flip chip bonding of the semiconductor chip 22A to the substrate 23A is as follows. On the chip mounting side 35 of the substrate 23A, a resin sheet that serves as an under-fill material 38 is beforehand arranged. The resin sheet to serve as the under-fill material 38 is arranged such that the resin sheet surrounds the formation position of the opening 29.

Further, stud bumps 37 are beforehand formed on the circuit formation side 30 of the semiconductor chip 22A. The stud bumps 37 are formed with metal, such as gold, and are formed at predetermined positions on the circuit formation side 30 using wire-bonding technology.

When the semiconductor chip 22A is mounted on the substrate 23A, heat is applied at a temperature at which the resin sheet to serve as the under-fill material 38 becomes soft, and demonstrates adhesive strength. Then, positioning is carried out such that the sensor unit 26 of the semiconductor chip 22A and the opening 29 of substrate 23A are in agreement, and flip chip bonding of the semiconductor chip 22A on the substrate 23A is carried out.

In this manner, the stud bumps 37 are electrically connected to the wiring layers 34, and, therefore, the semiconductor chip 22A is electrically connected to the substrate 23A. Here, since the under-fill material 38 protects the bonding of the wiring layer 34 and the stud bumps 37, the electric connection between the semiconductor chip 22A and the substrate 23A is reliably obtained. Further, the under-fill material 38 bonds the semiconductor chip 22A and the substrate 23A, i.e., the semiconductor chip 22A and the substrate 23A are mechanically joined by the under-fill material 38.

Further, although the resin sheet to serve as the under-fill material 38 is heated when the semiconductor chip 22A is joined to the substrate 23A, as described above, the heating temperature is such that the under-fill material 38 softens and demonstrates adhesive strength, but is not high enough to cause fusing of the under-fill material 38. Accordingly, the resin flash does not occur, i.e., the resin sheet is prevented from being melted, and from running onto the sensor unit 26.

Where the semiconductor chip 22A is mounted on the substrate 23A as mentioned above, the sensor unit 26 of the semiconductor chip 22A is exposed through the opening 29 formed in the substrate 23A, as shown in FIG. 4 and FIG. 6. Accordingly, fingerprint recognition is performed by a finger sweeping across the sensor unit 26 through the opening 29.

Figure 1:
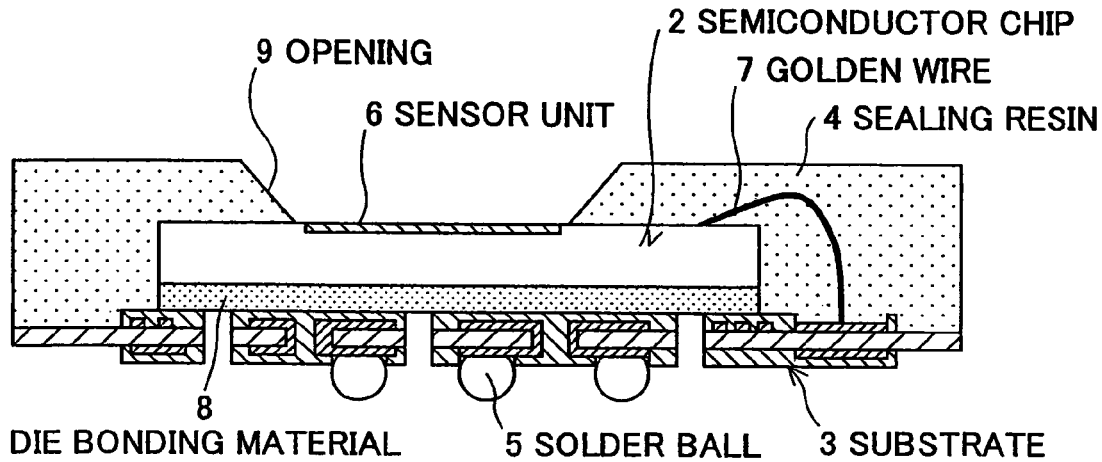
FIG. 1 is a cross-sectional view showing an example of a conventional semiconductor device for fingerprint recognition.

According to the fingerprint sensor 20A of the present embodiment, the opening 29 is beforehand formed in the substrate 23A at the position corresponding to the sensor unit 26, and the semiconductor chip 22A is flip chip bonded to the substrate 23A such that the sensor unit 26 corresponds to the opening 29. In this manner, the fingerprint sensor 20A of the present embodiment does not use the sealing resin 4 (refer to FIG. 1 through FIG. 3) that is conventionally used, and the resin flash, i.e., the sealing resin flowing into the sensor unit 26 of the semiconductor chip 22A is completely prevented from occurring.

Further, according to the present embodiment, a wire is not used for the electrical connection between the semiconductor chip 22A and the substrate 23A. For this reason, it is not necessary to provide a wiring space in the fingerprint sensor 20A, and, therefore, the fingerprint sensor 20A is made thin.

Next, the second embodiment of the present invention is explained.

Figure 7:
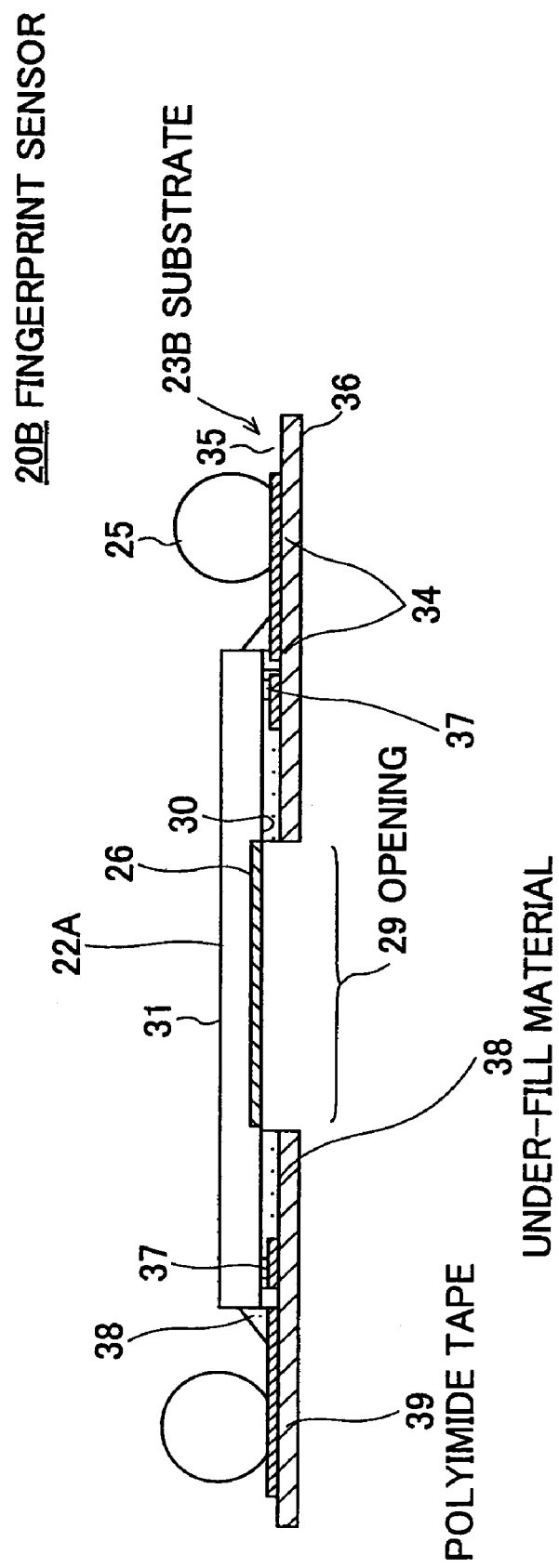
FIG. 7 is a cross-sectional view of the semiconductor device for fingerprint recognition according to the second embodiment of the present invention.

FIG. 7 is a cross-sectional view showing a fingerprint sensor 20B that is the second embodiment of the present invention. Here in FIG. 7, the same label is attached to the same component as in the configuration shown in FIG. 4 and FIG. 6, and the explanation thereof is not repeated.

While the fingerprint sensor 20A of the first embodiment uses a glass epoxy substrate for the substrate 23A that mounts the semiconductor chip 22A, the fingerprint sensor 20B according to the second embodiment is characterized by using a polyimide tape 39 as the base material for a substrate 23B for mounting the semiconductor chip 22A.

The wiring layer 34 of a predetermined pattern is formed on the chip mounting side 35 of the substrate 23B. At an electrode section of the wiring layer 34, the stud bumps 37 of the semiconductor chip 22A are flip chip bonded. Further, the opening 29 is formed in the substrate 23B, and the semiconductor chip 22A is mounted on the substrate 23B such that the sensor unit 26 corresponds to the opening 29.

As described above, the substrate 23B of the present embodiment is formed by the polyimide tape 39 serving as the base material, and, therefore, can be made thinner than the substrate 23A that employs the glass epoxy substrate. Accordingly, the fingerprint sensor 20B of the present embodiment can be made thin by using the substrate 23B of the polyimide tape 39 as the base material for mounting the semiconductor chip 22A.

Next, the third embodiment of the present invention is explained.

Figure 8:
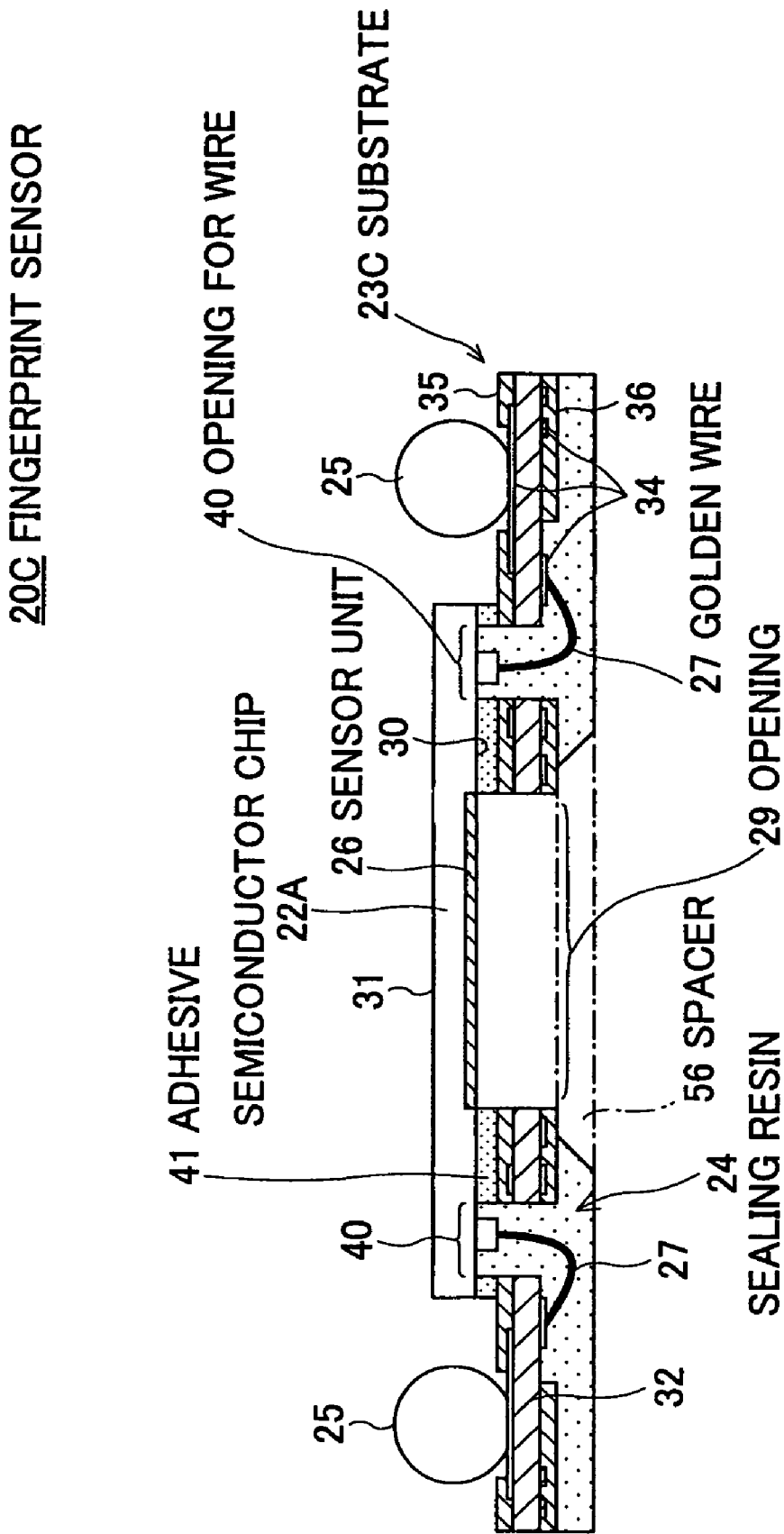
FIG. 8 is a cross-sectional view of the semiconductor device for fingerprint recognition according to the third embodiment of the present invention.

FIG. 8 is a cross-sectional view showing a fingerprint sensor 20C according to the third embodiment of the present invention. In FIG. 8, the same label is attached to the same component as in the configuration shown in FIG. 4 and FIG. 6, and the explanation thereof is not repeated.

In the case of the fingerprint sensor 20A of the first embodiment, the semiconductor chip 22A is flip chip bonded to the substrate 23A using the stud bumps 37. Conversely, the fingerprint sensor 20C according to the present embodiment uses golden wires 27 for the electric connection between the semiconductor chip 22A and the substrate 23C. Further, in the present embodiment, in order to protect the golden wires 27, a sealing resin 24 is provided.

The opening 29 is also formed in the substrate 23C of the present embodiment, and the semiconductor chip 22A is mounted on the substrate 23C such that the sensor unit 26 corresponds to the opening 29. According to the present embodiment, mechanical bonding of the semiconductor chip 22A to the substrate 23C is performed using an adhesive 41.

According to the present embodiment, the golden wires 27 of the semiconductor chip 22A are bonded on the circuit formation side 30, and the circuit formation side 30 is adhesively fixed to the chip mounting side 35 of the substrate 23C. For this reason, openings for wire 40 are formed in the substrate 23C, in addition to the opening 29. The openings for wire 40 are prepared in the positions that correspond to the bonding positions of the golden wires 27 of the semiconductor chip 22A.

Accordingly, one end of each golden wire 27 is connected to the predetermined bonding position of the circuit formation side 30 of the semiconductor chip 22A, and the other end is connected to the wiring layer 34 that is formed on an opposite side 36 of the substrate 23C (i.e., the side of the substrate 23C opposite to the chip mounting side 35 that mounts the semiconductor chip 22A), the golden wire 27 passing through the opening for wire 40.

Further, in order to protect the golden wires 27, the sealing resin 24 is formed on the opposite side 36 of the substrate 23C. The sealing resin 24 is formed such that the opposite side 36 of the substrate 23C is covered except for the formation position of the opening 29. Further, the sealing resin 24 is also formed in the openings for wire 40, protecting the golden wires 27.

Figure 2:
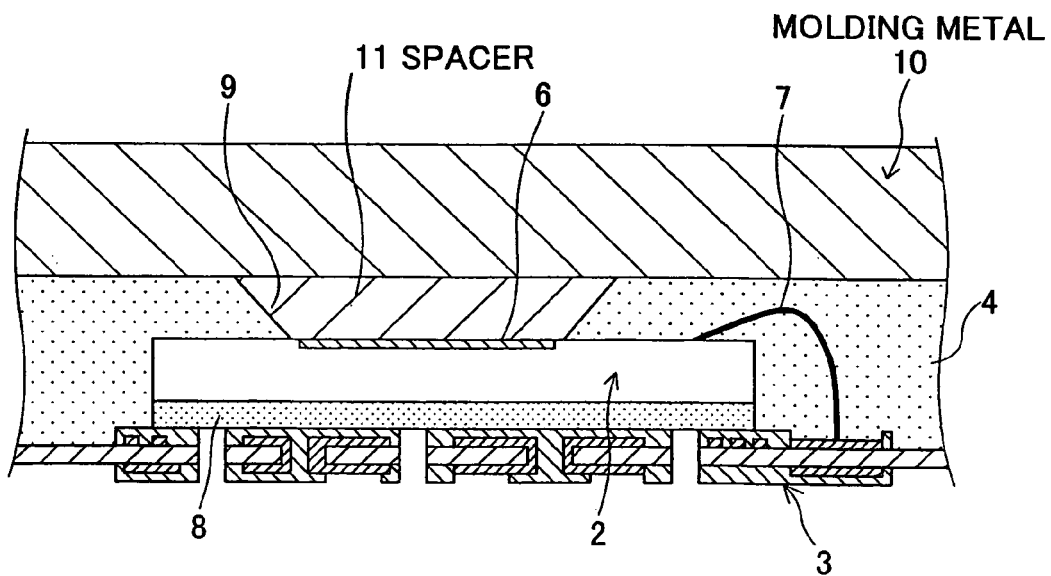
FIG. 2 is a cross-sectional view for explaining the manufacturing method of the conventional semiconductor device for fingerprint recognition.
Figure 3:
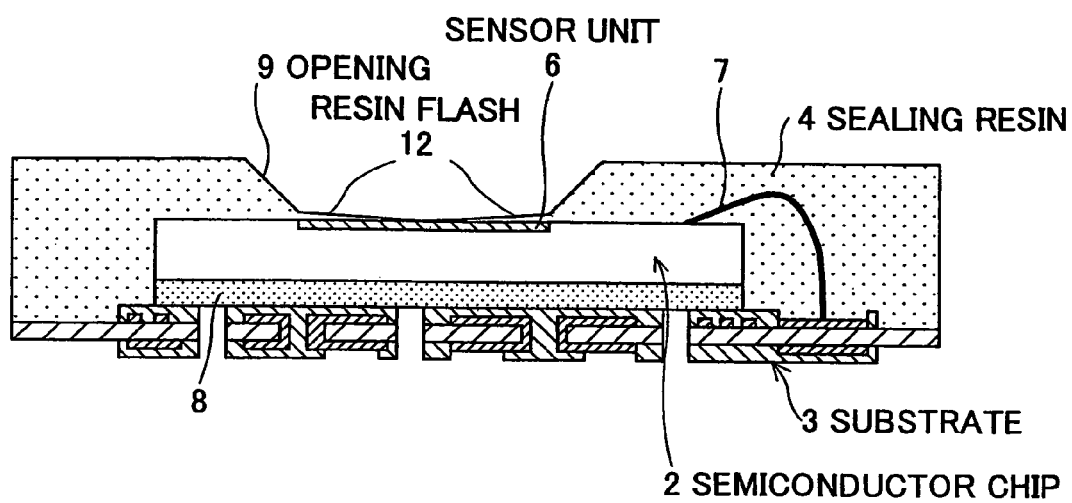
FIG. 3 is a cross-sectional view for explaining the problems of the conventional semiconductor device for fingerprint recognition.

The sealing resin 24 is formed by using a molding metal (not shown; refer to FIG. 2). When the sealing resin 24 is formed, a spacer 56 (indicated by a chain line in FIG. 8) is prepared between the molding metal and the substrate 23C for forming the opening 29 (i.e., such that the sealing resin 24 is not formed where the opening 29 is formed). With the conventional fingerprint sensor 1, the spacer 11 directly contacts the sensor unit 6 of the semiconductor chip 2 as explained in reference to FIG. 2. For this reason, damage can occur to the semiconductor chip 2 and the sensor unit 6.

On the other hand, according to the present embodiment, the spacer 56 used when forming the sealing resin 24 contacts the opposite side 36 of the substrate 23C. Thus, since the spacer 56 contacts the substrate 23C instead of the sensor unit 26, damage does not occur to the semiconductor chip 22A and the sensor unit 26 when forming the sealing resin 24, and it raises the reliability of the fingerprint sensor 20C.

In the case that a resin leak occurs from the contact section with the spacer 56, the resin flash is generated on the opposite side 36 of the substrate 23C, and the sensor unit 26 is not influenced; therefore, proper operations of the semiconductor chip 22A are obtained, and the reliability of the fingerprint sensor 20C is raised.

Further, although the golden wire 27 is used in the present embodiment, the golden wire 27 electrically connects the semiconductor chip 22A and the substrate 23C through the opening for wire 40 formed in the substrate 23A. That is, a part of the height of the wire loop is included in the thickness of the substrate 23C. Accordingly, the fingerprint sensor 20C can be made thinner than the conventional fingerprint sensor 1 (refer to FIG. 1).

Next, the fourth embodiment of the present invention is explained.

Figure 9:
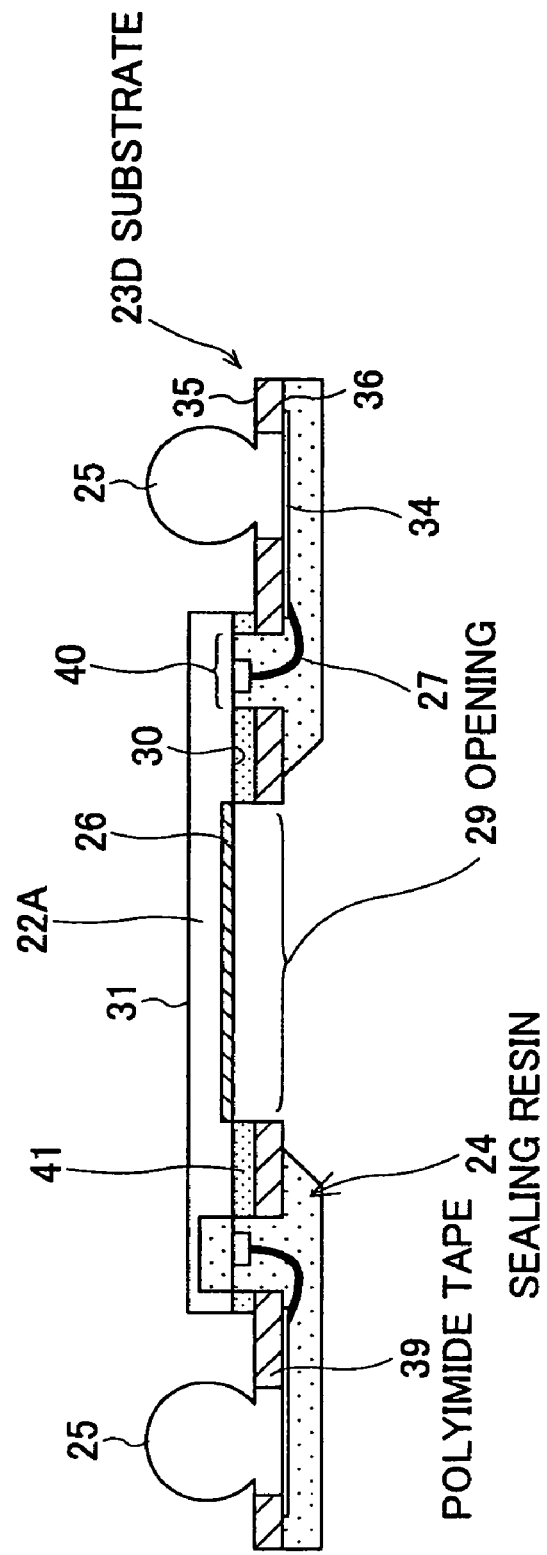
FIG. 9 is a cross-sectional view of the semiconductor device for fingerprint recognition according to the fourth embodiment of the present invention.

FIG. 9 is a cross-sectional view showing a fingerprint sensor 20D that is the fourth embodiment of the present invention. Here in FIG. 9, the same label is attached to the same component as in the configuration shown in FIG. 4, FIG. 7, and FIG. 8, and the explanation thereof is not repeated.

The fingerprint sensor 20D according to the present embodiment is differentiated from the fingerprint sensor 20C of the third embodiment that is shown by FIG. 8 in that the polyimide tape 39 is used as the base material of a substrate 23D for mounting the semiconductor chip 22A.

As for the substrate 23D, the opening 29 and the openings for wire 40 are formed. The semiconductor chip 22A is adhesively fixed to the chip mounting side 35 of the substrate 23D by the adhesive 41.

Further, the semiconductor chip 22A and the substrate 23D are electrically connected by the golden wires 27. The golden wires 27 that electrically connect the semiconductor chip 22A and the substrate 23D are prepared through the openings for wire 40 formed in the substrate 23D. Furthermore, on the opposite side 36 of the substrate 23C, the sealing resin 24 for protecting the golden wires 27 is formed.

As described above, the substrate 23D made of the polyimide tape 39 base material is made thinner than the substrate 23C that employs the glass epoxy substrate. Accordingly, the fingerprint sensor 20D of the present embodiment is made thin by using the substrate 23D of the polyimide tape 39 base material as the substrate for mounting the semiconductor chip 22A.

Next, the fifth embodiment of the present invention is explained.

Figure 10:
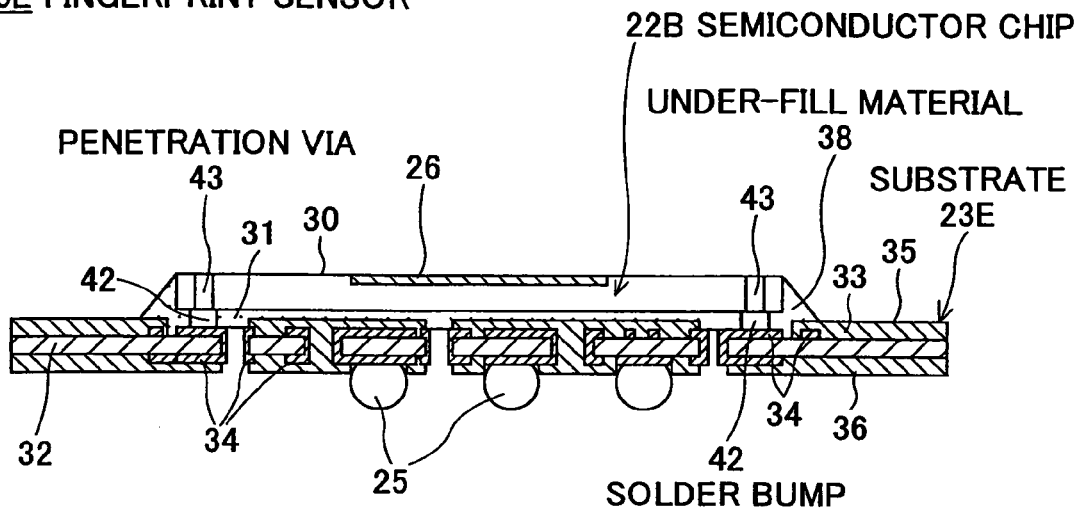
FIG. 10 is a cross-sectional view of the semiconductor device for fingerprint recognition according to the fifth embodiment of the present invention.

FIG. 10 is a cross-sectional view showing a fingerprint sensor 20E that is the fifth embodiment of the present invention. Here in FIG. 10, the same label is attached to the same component as in the configuration shown in FIG. 4 and FIG. 6, and the explanation thereof is not repeated.

In the first through fourth embodiments descried above, the semiconductor chip 22A is arranged on the substrates 23A through 23D such that the circuit formation side 30 of the semiconductor chip 22A faces with the chip mounting side 35 of the substrates 23A through 23D, respectively. Conversely, according to the present embodiment, the fingerprint sensor 20E is structured such that the semiconductor chip 22B is mounted on the substrate 23E with a backside 31 that is not the circuit formation side of the semiconductor chip 22B facing the chip mounting side 35 of the substrate 23E.

Accordingly, the circuit formation side 30 and the sensor unit 26 of the semiconductor chip 22B of the fingerprint sensor 20E of the present embodiment face outside (upward in FIG. 10). For this reason, in order to electrically connect the substrate 23E to electronic circuitry and the sensor unit 26 that are formed on the circuit formation side 30, penetration vias 43 are formed in the semiconductor chip 22B according to the present embodiment.

Each penetration via 43 is formed by a conductive metal provided to a hole that vertically penetrates the semiconductor chip 22B. In this manner, the penetration via 43 functions as wiring that electrically connects the circuit formation side 30 and the backside 31 of the semiconductor chip 22B. An upper end of the penetration via 43 is connected to the sensor unit 26 and the electronic circuitry formed on the circuit formation side 30, and a solder bump 42 is arranged at a lower end of the penetration via 43.

The semiconductor chip 22B as described above is mounted on the substrate 23E by bonding the solder bump 42 and the wiring layer 34 formed on the substrate 23E. Further, the under-fill material 38 is arranged between the semiconductor chip 22B and the substrate 23E so that the mechanical bonding nature of the semiconductor chip 22B and the substrate 23E is enhanced, and the bonding positions of the penetration vias 43 and the wiring layer 34 are protected. As described above, according to the present embodiment, since the sensor unit 26 faces outside, an opening, such as the opening 29 in other embodiments, is not formed in the substrate 23E.

According to the fingerprint sensor 20E of the present embodiment, the sensor unit 26 faces outside, and the electrical connection between the semiconductor chip 22B and the substrate 23E is performed using the penetration vias 43. That is, according to the present embodiment wherein the sensor unit 26 faces outside, the semiconductor chip 22B and the substrate 23E are electrically connected without using a wire such as the golden wire 7 of the fingerprint sensor 1 (referring to FIG. 1). Since the golden wire 7 is not used, there is no need to form the sealing resin 4 for protecting the golden wire 7.

Accordingly, the fingerprint sensor 20E is made flat with no components, such as sealing resin, being provided on the circuit formation side 30 on which the sensor unit 26 is formed. That is, since there is nothing that hits a finger when sweeping the sensor unit 26, usability is raised. Further, since the sealing resin is not used, resin flash is not a concern, and the fingerprint sensor 20E is made thin.

In the following, the sixth embodiment of the present invention is explained.

Figure 11:
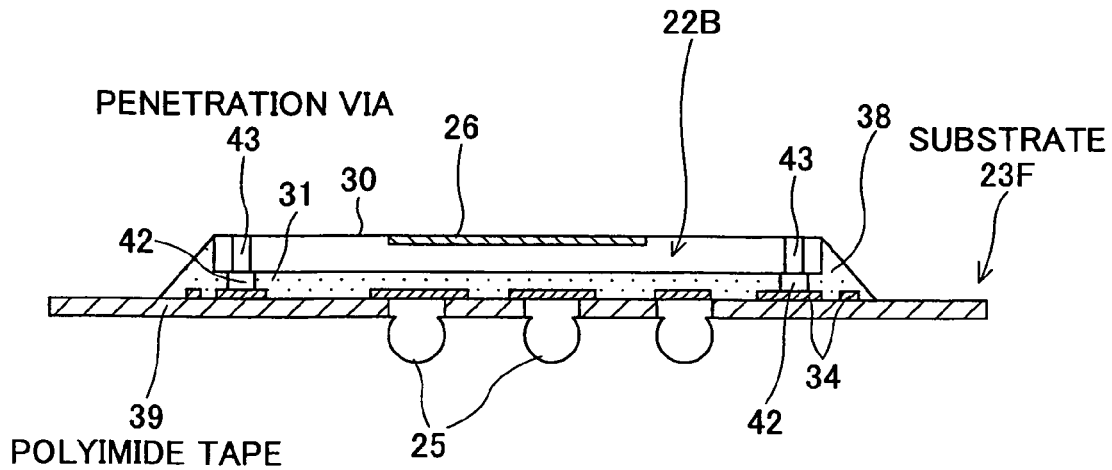
FIG. 11 is a cross-sectional view of the semiconductor device for fingerprint recognition according to the sixth embodiment of the present invention.

FIG. 11 is a cross-sectional view showing a fingerprint sensor 20F that is the sixth embodiment of the present invention. Here in FIG. 11, the same label is attached to the same component as in the configuration shown in FIG. 4, FIG. 7, and FIG. 10, and the explanation thereof is not repeated.

The fingerprint sensor 20F of the present embodiment is the same as the fingerprint sensor 20E of the fifth embodiment shown in FIG. 10, except that the polyimide tape 39 is used as the base material of a substrate 23F for mounting the semiconductor chip 22B.

The substrate 23F using the polyimide tape 39 as the base material is made thin compared with the substrate 23E that is a glass epoxy substrate. Accordingly, the fingerprint sensor 20F is made thin by using the substrate 23F that uses the polyimide tape 39 as the base material for mounting the semiconductor chip 22B.

Next, the seventh through the twelfth embodiments of the present invention are explained.

FIG. 12 through FIG. 17 are cross-sectional views showing fingerprint sensors 20G through 20L, respectively, that are the seventh through the twelfth embodiments, respectively, of the present invention. Here in FIG. 12 through FIG. 17, the same label is attached to the same component as in the configuration shown in FIG. 4 through FIG. 11, and the explanation thereof is not repeated.

The fingerprint sensors 20G through 20L that are the seventh through the twelfth embodiments, respectively, are the same as the fingerprint sensors 20A through 20F, respectively, of the first through the sixth embodiments, respectively, except that flexible substrates 45A through 45F, respectively, are used as the substrate for mounting the semiconductor chips 22A and 22B, as applicable. The flexible substrates 45A through 45F are structured with an insulated resin tape 46 that consists of a resin, such as polyimide, on which a printed circuit 47 of a predetermined pattern is provided.

The structure of the fingerprint sensors 20G through 20J shown in FIG. 12 through FIG. 15, respectively, are such that the sensor unit 26 of the semiconductor chip 22A faces the flexible substrates 45A through 45D, respectively. Accordingly, the opening 29 is formed in the flexible substrates 45A through 45D such that the sensor unit 26 is accessible.

Figure 12:
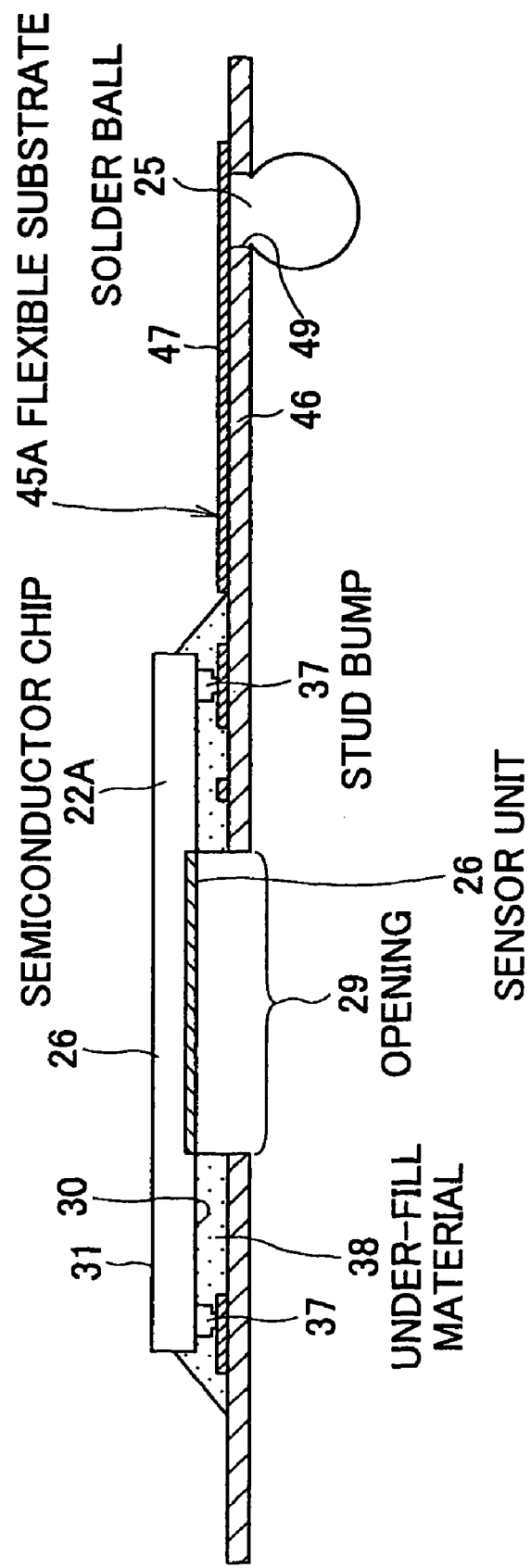
FIG. 12 is a cross-sectional view of the semiconductor device for fingerprint recognition according to the seventh embodiment of the present invention.
Figure 13A:
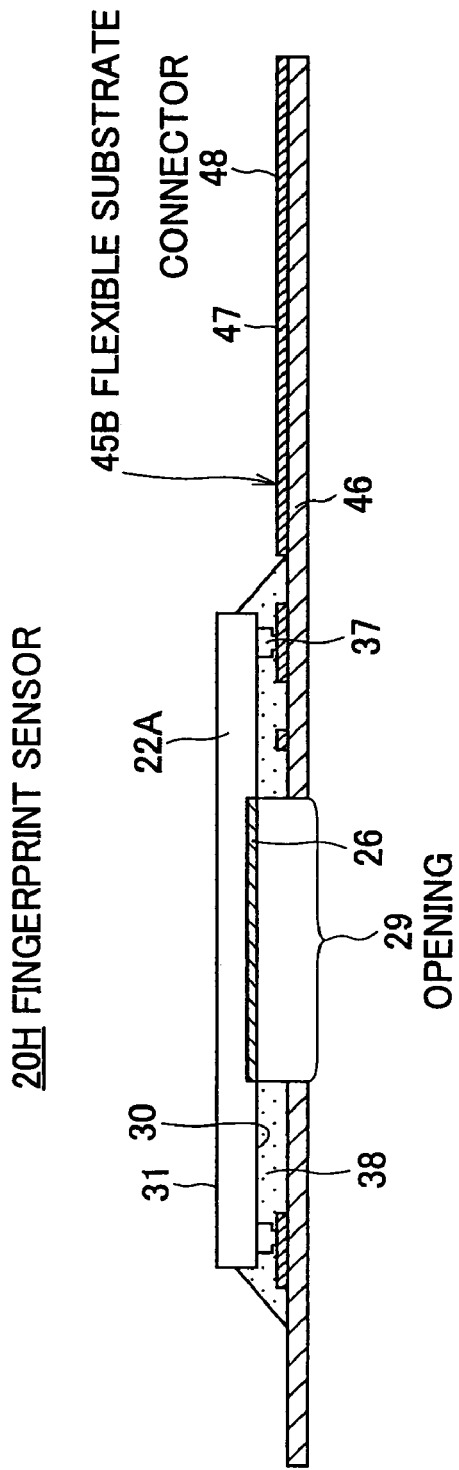
FIG. 13 is a cross-sectional view of the semiconductor device for fingerprint recognition according to the eighth embodiment of the present invention.
Figure 13B:
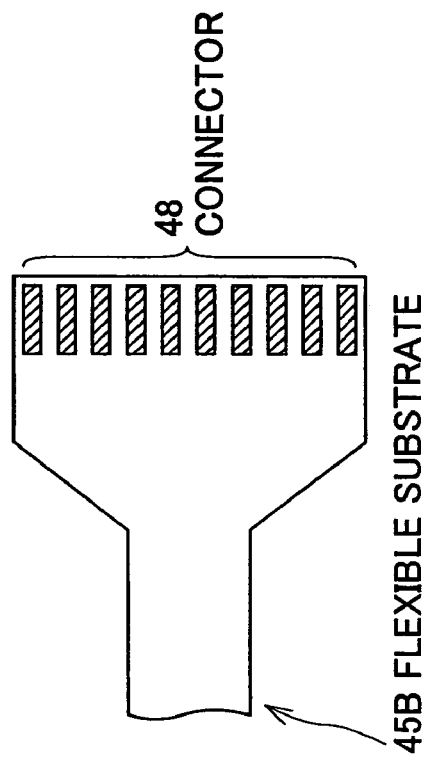

Further, as for the fingerprint sensors 20G and 20H of the seventh and the eighth embodiments, respectively, shown in FIG. 12 and FIG. 13, respectively, the semiconductor chip 22A is flip chip bonded at the flexible substrates 45A and 45B, respectively, using the stud bump 37. On the other hand, as for the fingerprint sensors 20I and 20J of the ninth and the tenth embodiments, respectively, shown in FIG. 14 and FIG. 15, respectively, the semiconductor chip 22A is flip chip bonded at the flexible substrates 45C and 45D, respectively, using the golden wire 27. Accordingly, the sealing resin 24 is formed in the fingerprint sensors 20I and 20J for protecting the golden wire 27.

Figure 17A:
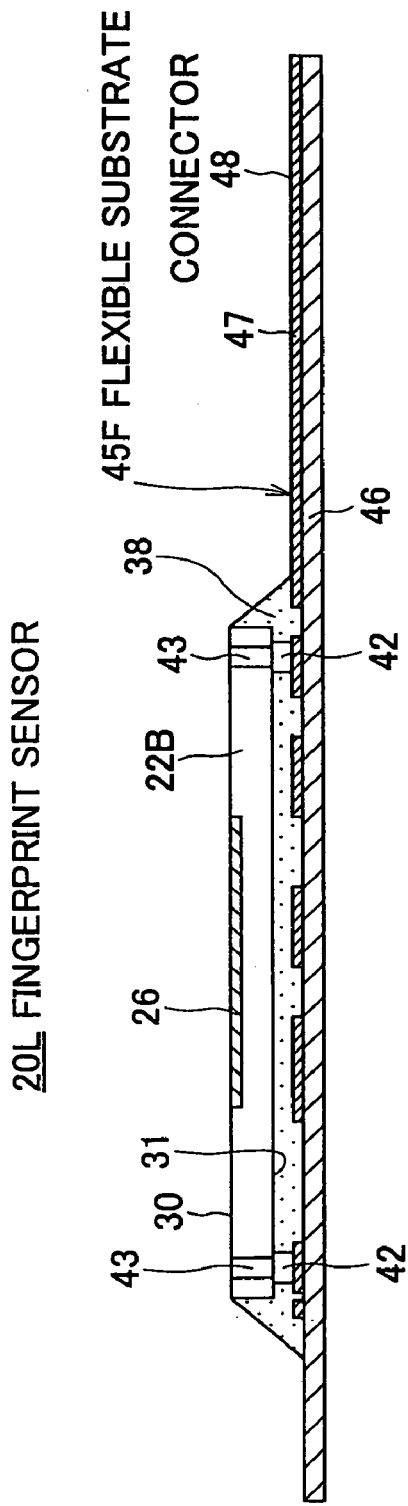
FIG. 17 is a cross-sectional view of the semiconductor device for fingerprint recognition according to the twelfth embodiment of the present invention.
Figure 17B:
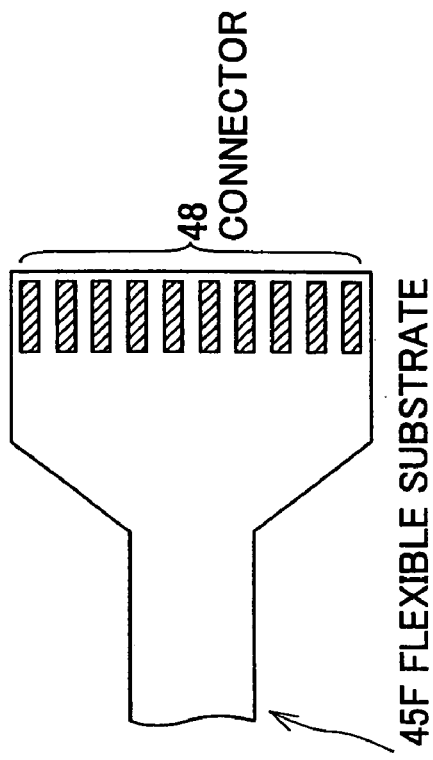

Further, in the cases of the fingerprint sensors 20K and 20L shown in FIG. 16 and FIG. 17, respectively, the semiconductor chip 22B is mounted on the flexible substrates 45E and 45F, respectively, with the sensor unit 26 facing outside, i.e., upward in the respective drawings. For this reason, the semiconductor chip 22B is connected to the flexible substrates 45E and 45F using the solder bumps 42 formed at the lower end of the penetration via 43.

Figure 14:
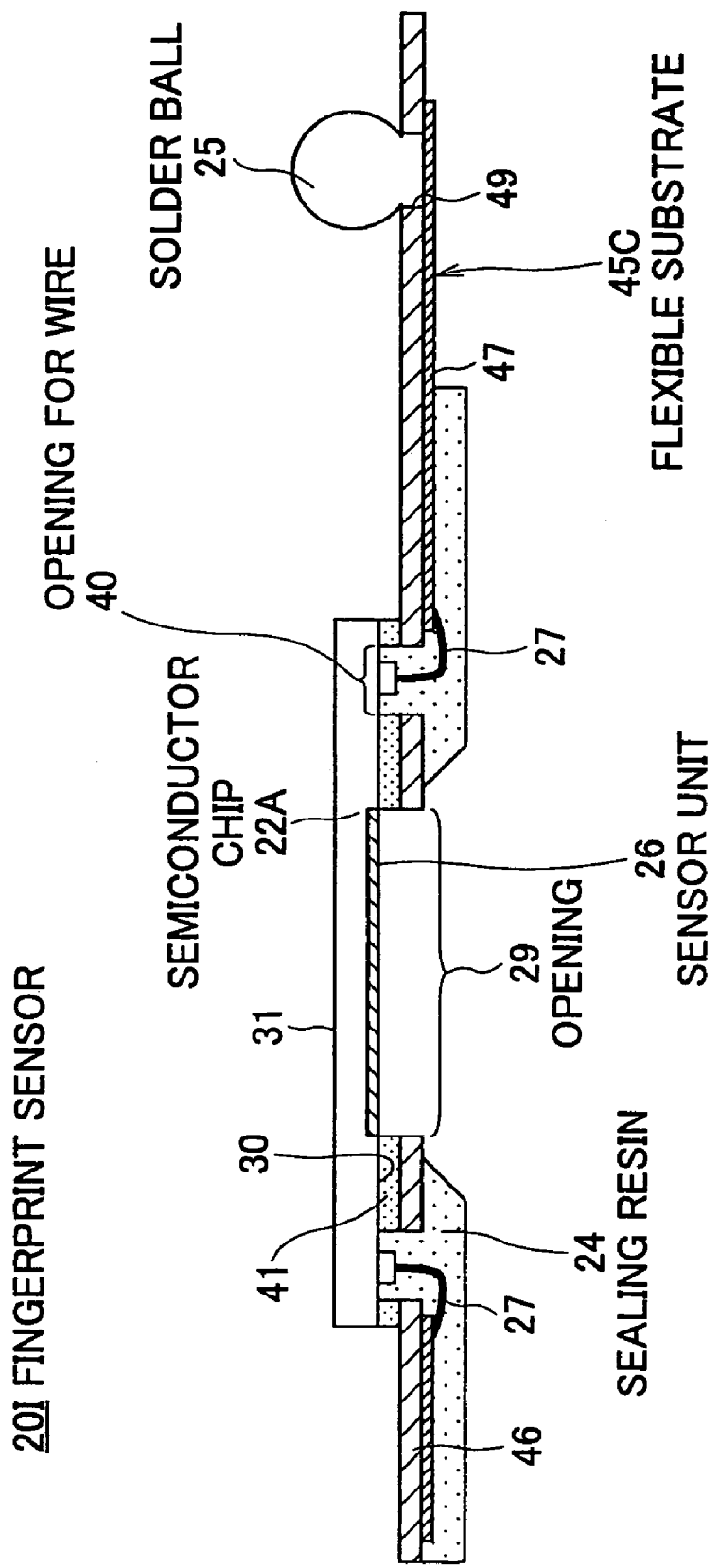
FIG. 14 is a cross-sectional view of the semiconductor device for fingerprint recognition according to the ninth embodiment of the present invention.

As for the fingerprint sensors 20G, 20I, and 20K shown in FIG. 12, FIG. 14, and FIG. 16, respectively, the solder balls 25 arranged on the flexible substrates 45A, 45C, and 45E, respectively, are used as external connection terminals. The solder balls 25 are connected to the printed circuit 47 by through holes 49 formed in the insulated resin tape 46.

As for the fingerprint sensors 20H, 20J, and 20L shown in FIG. 13, FIG. 15, and FIG. 17, respectively, a connector section 48 is arranged on the flexible substrates 45B, 45D, and 45F, respectively, and used as an external connection terminal. The connector section 48 is formed in the right end section in each view of the flexible substrates 45B, 45D, and 45F. In addition, at the drawing section (B) of FIG. 13, FIG. 15, and FIG. 17, a plan view of the connector section 48 is shown.

As mentioned above, since the flexible substrates 45A through 45F that can be bent are used as the substrate for mounting the semiconductor chips 22A and 22B, as applicable, the fingerprint sensors 20G through 20L, respectively, can be shaped as required by an electronic apparatus that is equipped with the fingerprint sensors 20G through 20L.

In this manner, the mounting nature of the fingerprint sensors 20G through 20L to electronic apparatuses is improved. Further, since the solder balls 25 and the connector section 48 that are generally and economically available are used as the external connection terminal, even when the flexible substrates 45A through 45F are used as the substrate for mounting the semiconductor chips 22A and 22B, as applicable, the flexible substrates 45A through 45F are economically realized.

Next, the thirteenth embodiment of the present invention is explained.

Figure 18:
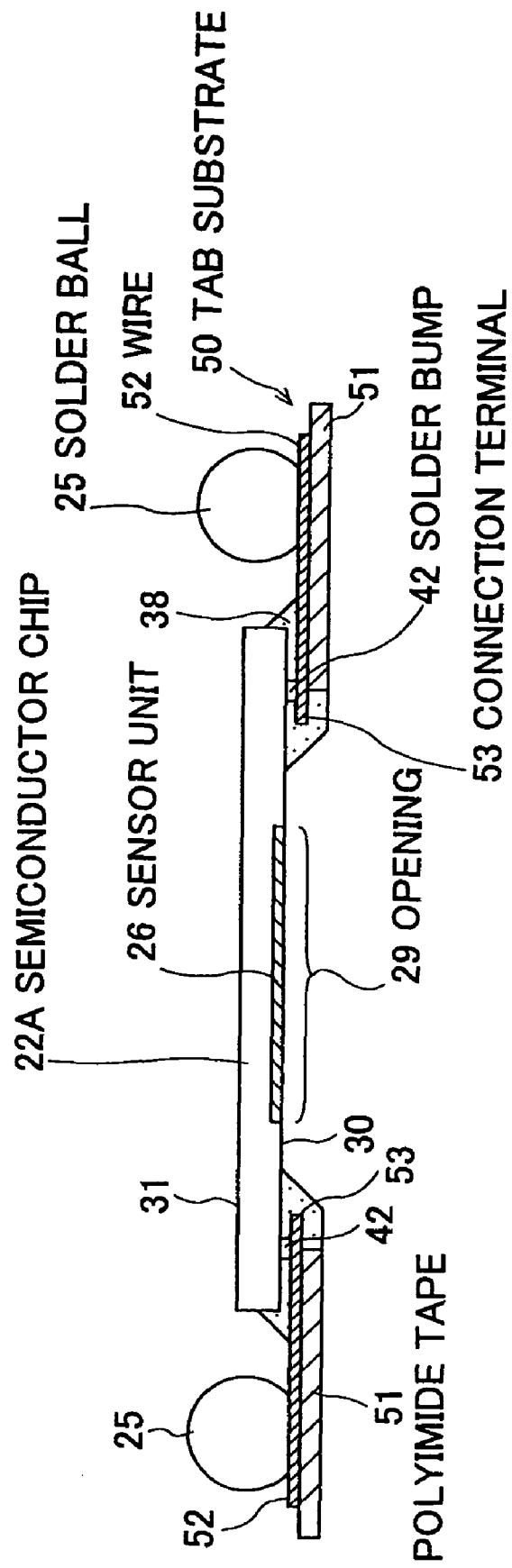
FIG. 18 is a cross-sectional view of the semiconductor device for fingerprint recognition according to the thirteenth embodiment of the present invention.

FIG. 18 is a cross-sectional view showing a fingerprint sensor 20M that is the thirteenth embodiment of the present invention. Here in FIG. 18, the same label is attached to the same component as in the configuration shown in FIG. 4 and FIG. 6, and the explanation thereof is not repeated.

The fingerprint sensor 20M according to the present embodiment is characterized by using a TAB (Tape Automated Bonding) tape 50 as the substrate for mounting the semiconductor chip 22A.

The TAB tape 50 includes a polyimide tape 51 that has the opening 29 at the central position, and a wiring 52 formed on the polyimide tape 51. Further, a part of the wiring 52 extends into the opening 29 as a connection terminal 53, and the solder bump 42 of the semiconductor chip 22A is flip chip bonded to the connection terminal 53.

Since the TAB tape 50 allows the wiring 52 being densely formed, the number of terminals of the semiconductor chip 22A can be increased. That is, according to the present embodiment, the number of the solder bumps 42 can be increased by using the TAB tape 50 as the substrate for mounting the semiconductor chip 22A.

Next, the fourteenth embodiment of the present invention is explained.

Figure 19:
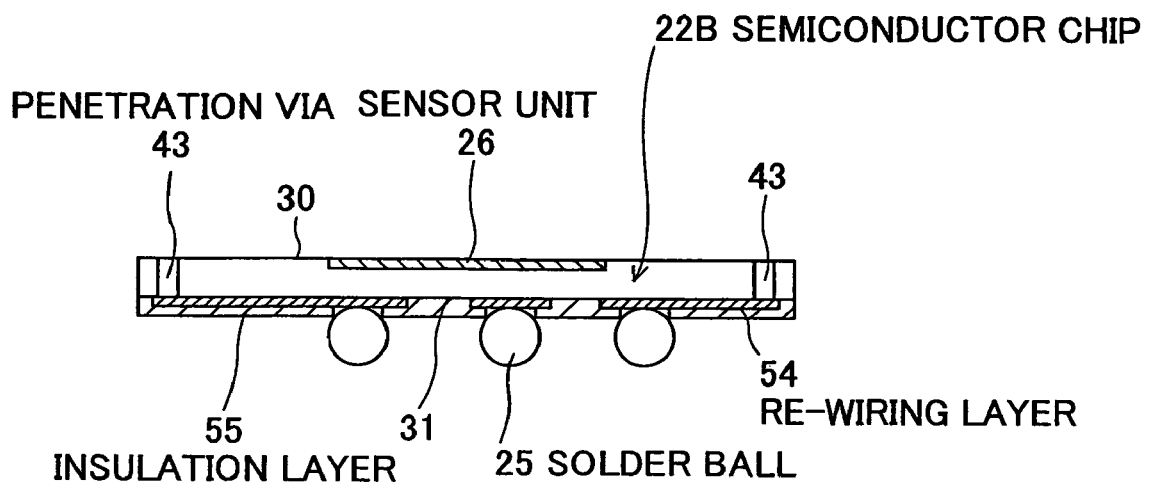
FIG. 19 is a cross-sectional view of the semiconductor device for fingerprint recognition according to the fourteenth embodiment of the present invention.

FIG. 19 is a cross-sectional view showing a fingerprint sensor 20N that is the fourteenth embodiment of the present invention. Here in FIG. 19, the same label is attached to the same component as in the configuration shown in FIG. 4 or FIG. 6, and the explanation thereof is not repeated.

The structure of the fingerprint sensor 20N of the present embodiment is the so-called CSP (Chip Size Package) structure. The penetration via 43 is prepared in the semiconductor chip 22B. The sensor unit 26 and the electronic circuitry formed on the circuit formation side 30 are connected to a re-wiring layer 54 formed on the backside 31 of the semiconductor chip 22B by the penetration via 43. The solder balls 25 used as the external connection terminals are arranged at the re-wiring layer 54.

According to the fingerprint sensor 20N of the present embodiment, unlike the embodiments described above, a substrate is not used as the interposer for providing the electrical connection between the sensor unit 26 and the solder balls 25, but the penetration vias 43 are prepared in the semiconductor chip 22B, and the re-wiring layer 54 is formed on the backside 31 of the semiconductor chip 22B for providing the electrical connection between the sensor unit 26 and the solder balls 25.

In this manner, the fingerprint sensor 20N can be made in almost the same size as the semiconductor chip 22B, helping miniaturization of electronic apparatuses. Further, the fingerprint sensor 20N can be manufactured on the wafer level, improving the productivity and realizing cost reduction.

ADVANTAGE OF THE PRESENT INVENTION

As described above, according to the present invention, various effects are realized such as described below.

Since the first mode of the present invention does not require a sealing resin that is conventionally used, the resin flash (the sealing resin flowing into the fingerprint recognition area of the semiconductor chip) is not a concern. Even though the sealing resin is not used, satisfactory reliability of the semiconductor device for fingerprint recognition is obtained. Furthermore, since a wire is not used, it is not necessary to secure a space for forming a wire loop, and the semiconductor device for fingerprint recognition can be made thin.

Further, according to the second mode of the present invention, although sealing resin is employed, the sealing resin is prepared in the opposite side of the substrate, therefore, the sealing resin does not run into the semiconductor chip, and, accordingly, the sealing resin does not flow into the fingerprint recognition area. Further, since a part of the height of the wire loop is overlapped by the thickness of the substrate, even if a wire is used, the semiconductor device for fingerprint recognition according to the present invention can be made thin compared with conventional products.

Further, according to the third mode of the present invention, the fingerprint recognition area formation side of the semiconductor device for fingerprint recognition becomes flat, which enhances the usability when performing fingerprint recognition. Further, since sealing resin is not used, resin flash is not a concern.

Further, according to the present invention, various kinds of substrate materials can be used as the substrate.

Further, as an external connection terminal prepared on the substrate, a solder ball and a connector that are generally and economically available are used according to the present invention.

Further, according to the present invention, the semiconductor device for fingerprint recognition can be made almost as thin and small as the semiconductor chip.

Further, since fingerprint recognition according to the present invention is performed based on the electrostatic-capacity principle, and not optically, the semiconductor device for fingerprint recognition can be miniaturized.

Further, the present invention is not limited to these embodiments, but various variations and modifications may be made without departing from the scope of the present invention.

The present application is based on Japanese priority application No. 2003-097095 filed on Mar. 31, 2003 with the Japanese Patent Office, the entire contents of that are hereby incorporated by reference.

What is claimed is:

1. A semiconductor device for fingerprint recognition, comprising:
   a semiconductor chip having a fingerprint recognition area at a first surface of said semiconductor chip for performing fingerprint recognition, said semiconductor chip carrying a sensor unit on said first surface in correspondence to said fingerprint recognition area,
   a substrate having a first surface of said substrate and a second surface of said substrate opposing to said first surface of said substrate, said semiconductor chip being mounted upon said substrate such that said first surface of said semiconductor chip contacts with said first surface of said substrate via an adhesive layer,
   said substrate having a first opening that corresponds to said fingerprint recognition area, and a second opening, each of said first and second opening penetrating through said substrate from said first surface of said substrate to said second surface of said substrate, and said semiconductor chip being electrically connected to a wiring pattern provided on said second surface of said substrate by a wire that is put through said second opening,
   a sealing resin for protecting said semiconductor chip and said substrate, said sealing resin being provided on said second surface of said substrate so as to fill said second opening,
   said substrate carrying a solder ball on said first surface of said substrate.

* * * * *